United States Patent
Chua et al.

(10) Patent No.: US 8,822,314 B2
(45) Date of Patent: Sep. 2, 2014

(54) METHOD OF GROWING EPITAXIAL LAYERS ON A SUBSTRATE

(75) Inventors: Christopher L. Chua, San Jose, CA (US); Mark R. Teepe, Menlo Park, CA (US); Thomas Wunderer, Palo Alto, CA (US); Zhihong Yang, San Jose, CA (US); Noble M. Johnson, Menlo Park, CA (US); Clifford Knollenberg, San Bruno, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 100 days.

(21) Appl. No.: 13/523,670

(22) Filed: Jun. 14, 2012

(65) Prior Publication Data

US 2014/0011345 A1    Jan. 9, 2014

(51) Int. Cl.
*H01L 21/20* (2006.01)
*H01L 21/322* (2006.01)
*H01L 21/02* (2006.01)

(52) U.S. Cl.
CPC ...... *H01L 21/02658* (2013.01); *H01L 21/0254* (2013.01); *H01L 21/02661* (2013.01); *H01L 21/02389* (2013.01)
USPC .......................................... 438/503; 438/474

(58) Field of Classification Search
CPC .............................. H01L 21/302; H01L 21/461
USPC ......... 438/503–504, 603, 604, 930, 471, 474, 438/476, 694, 695, 906; 257/190, E21.224, 257/E21.222, E21.226; 216/67; 134/1.1, 134/1.2, 1.3
See application file for complete search history.

(56) References Cited

U.S. PATENT DOCUMENTS

| | | | | |
|---|---|---|---|---|
| 5,300,189 A | * | 4/1994 | Kokaku et al. | 216/67 |
| 5,624,529 A | * | 4/1997 | Shul et al. | 438/718 |
| 5,993,542 A | * | 11/1999 | Yanashima et al. | 117/84 |
| 6,066,568 A | * | 5/2000 | Kawai et al. | 438/707 |
| 7,741,632 B2 | * | 6/2010 | Xiong et al. | 257/13 |
| 7,960,284 B2 | | 6/2011 | Hachigo et al. | |
| 8,088,672 B2 | * | 1/2012 | Lee et al. | 438/458 |
| 8,389,975 B2 | * | 3/2013 | Kikuchi et al. | 257/13 |
| 2003/0049916 A1 | * | 3/2003 | Surya et al. | 438/478 |
| 2004/0131795 A1 | * | 7/2004 | Kuo et al. | 427/571 |
| 2007/0240631 A1 | * | 10/2007 | Nijhawan et al. | 117/98 |
| 2008/0176400 A1 | | 7/2008 | Hachigo et al. | |

(Continued)

FOREIGN PATENT DOCUMENTS

| | | | |
|---|---|---|---|
| CN | 102208522 A | * | 10/2011 |
| EP | 1950800 | | 7/2008 |
| JP | 2006060069 | | 3/2006 |

OTHER PUBLICATIONS

Hyun cho, Wet chemical Etching survey of III-Nitrides, Feb. 16, 1999, whole document.*

(Continued)

*Primary Examiner* — Julio J Maldonado
*Assistant Examiner* — Sheikh Maruf
(74) *Attorney, Agent, or Firm* — Hollingsworth Davis, LLC

(57) ABSTRACT

An epitaxial growth method includes plasma treating a surface of a bulk crystalline Aluminum Nitride (AlN) substrate and subsequently heating the substrate in an ammonia-rich ambient to a temperature of above 1000° C. for at least 5 minutes without epitaxial growth. After heating the surface, a III-nitride layer is epitaxially grown on the surface.

22 Claims, 6 Drawing Sheets

(56) References Cited

U.S. PATENT DOCUMENTS

2009/0149008 A1* 6/2009 Kryliouk et al. .............. 438/503
2009/0205707 A1* 8/2009 Ikenoue et al. ............... 136/255
2011/0316001 A1* 12/2011 Lee et al. ........................ 257/76
2012/0141799 A1* 6/2012 Kub et al. ..................... 428/408
2013/0026525 A1* 1/2013 Chen et al. ...................... 257/98

OTHER PUBLICATIONS

Carl Fredrik Carlstrom, Ion beam etching of InP based materials, Stockholm 2001.*

* cited by examiner

METHOD OF GROWING EPITAXIAL LAYERS ON A SUBSTRATE

STATEMENT REGARDING FEDERALLY SPONSORED RESEARCH AND DEVELOPMENT

This invention was made with U.S. Government support through the Defense Advanced Research Projects Agency (DARPA) under Army Research Laboratory (ARL) Cooperative Agreement #W911NF-10-02-0102. The Government has certain rights in this invention.

SUMMARY

Embodiments described herein involve and epitaxial growth method. The method includes plasma treating a surface of a bulk crystalline Aluminum Nitride (AlN) substrate. After the plasma treating, organics and metals are removed from the surface using one or more chemical etchants. After the organics and metals are removed, the surface is heated in an ammonia-rich ambient to a temperature of above 1000° C. for at least 5 minutes without epitaxial growth. After heating the surface, a III-nitride layer is epitaxially grown on the surface.

The method may also include, before plasma treating the surface, exposing the surface to at least one of acetone, methanol, isopropyl alcohol, sulfuric, phosphoric, nitric, and hydrochloric acid.

According to some aspects, heating the surface comprises introducing $H_2$ into a reaction chamber that encloses the surface. For example, the $H_2$ may be introduced the reaction chamber at a flow rate of greater than about 2 L/min and $NH_3$ may be introduced into the reaction chamber at a flow rate of greater than about 2 L/minute.

Plasma treating the surface can involve accelerating Ar plasma toward the surface and flowing a halogen-containing gas near the surface during a time that the Ar plasma is accelerated toward the surface. For example, the halogen-containing gas can comprises one or more of chlorine ($Cl_2$) and boron trichloride ($BCl_3$). For example, flowing the halogen-containing gas can involve flowing $BCl_3$ gas at a flow rate of about 2 cc/min, flowing $Cl_2$ gas at a flow rate of about 8 cc/min and flowing Ar gas at a flow rate of about 5 cc/min.

The Ar plasma can be generated using electron cyclotron resonance with a microwave power of about 350 W and a magnetic flux density of 1200 gauss, an accelerator voltage of about 100 Volts and a beam voltage of about 550 volts. According to some aspects, the plasma etching may be achieved using an inductively coupled plasma.

The surface can be oriented substantially perpendicular to the Ar plasma that is accelerated toward the surface and the surface may be rotated around an axis normal to the surface at about 10 degrees per second. A temperature of the surface may be maintained at about 25 degrees C. during the plasma treatment. The plasma treatment may be continued for about 30 minutes and/or until about 360 nm of substrate material is removed from the surface.

Removing the organics and metals from the surface may involve using one or more of sulfuric, phosphoric, nitric, and hydrochloric acid. For example, removing the organics and metals from the surface can be achieved by wet etching in sulfuric and phosphoric acid in a 3:1 solution heated to about 95 degrees C. for at least about 15 minutes.

According to various implementations, the epitaxially grown III-nitride layer may comprise InyAlxGa1−x−yN, wherein 0≤x≤1, 0≤y≤1. An exposed surface of the epitaxially grown III-nitride layer produced by the methods described herein can have a surface roughness less than about 10 nm.

Some epitaxial growth methods involve plasma treating a surface of a bulk crystalline Aluminum Nitride (AlN) substrate by accelerating an Ar plasma toward the surface. A halogen-containing gas comprising one or more of chlorine and boron trichloride is flowed near the surface during a time that the Ar plasma is accelerated toward the surface. After the plasma treating, organics and metals are removed from the surface using one or more chemical etchants. After removing the organics and metals, the method involves heating the surface in an ammonia-rich ambient to a temperature of above 1000° C. for at least 5 minutes without epitaxial growth. After heating the surface, an $In_yAl_xGa_{1−x−y}N$ layer is epitaxially grown on the surface, wherein 0≤x≤1 and 0≤y≤1.

The method produces an $In_yAl_xGa_{1−x−y}N$ 1 epitaxial layer having an exposed surface with a surface roughness less than about 10 nm.

According an epitaxial growth method described herein, a surface of a bulk crystalline Aluminum Nitride (AlN) substrate is exposed to at least one of acetone, methanol, isopropyl alcohol, sulfuric, phosphoric, nitric, and hydrochloric acid. After exposing the surface, the surface is plasma treated and then organics and metals are removed from the surface using one or more chemical etchants. After removing the organics and metals, the surface is heated in an ammonia-rich ambient to a temperature of above 1000° C. for at least 5 minutes without epitaxial growth. After heating the surface, a III-nitride layer is epitaxially grown on the surface.

Plasma treating the surface can include accelerating Ar plasma toward the surface while flowing a halogen-containing gas near the surface. Flowing the halogen-containing gas can involve flowing $BCl_3$ gas at a flow rate of about 2 cc/min, flowing $Cl_2$ gas at a flow rate of about 8 cc/min, and flowing Ar gas at a flow rate of about 5 cc/min.

DESCRIPTION OF VARIOUS EMBODIMENTS

Bulk crystalline aluminum nitride (AlN) substrates can be used to grow III-N heterostructures which are implemented as ultra-violet light emitters, light sensors, high bandgap electronics, and/or other products. Epitaxial III-N heterostructures on AlN substrates may be produced, for example, by metal-organic chemical vapor deposition (MOCVD). However, AlN substrates are highly reactive with the environment, and if the AlN substrates are not adequately prepared prior to MOCVD growth of the III-N heterostructure layers, the grown heterostructures can exhibit a large number of defects such as V-pits and high surface roughness. These defects either degrade device performance or preclude formation of certain devices. Embodiments described herein involve methods for growing epitaxial layers on bulk crystalline AlN substrates. These methods provide high-quality homoepitaxial and heteroepitaxial films.

Figure 1:
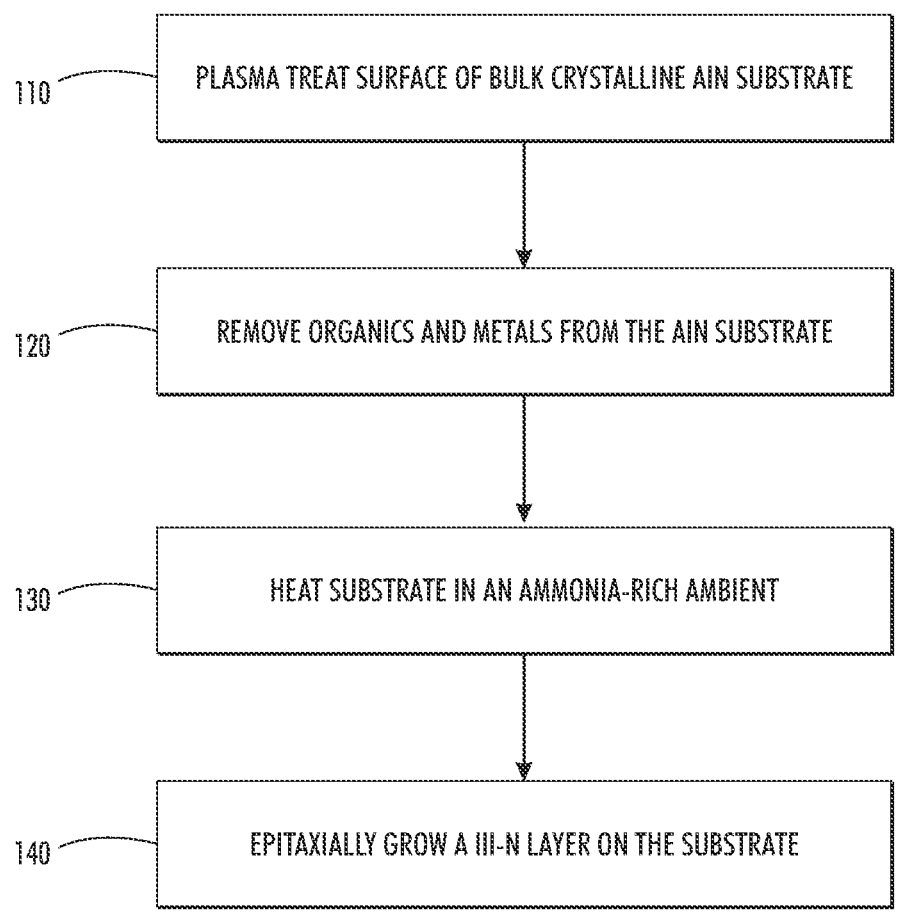
FIG. 1 is a flow diagram of a method for epitaxial growth on a bulk crystalline aluminum nitride (AlN) substrate in accordance with some embodiments.

FIG. 1 is a flow diagram illustrating an epitaxial growth method that includes a combination of gas phase and wet phase surface treatment. In the gas phase treatment, the surface of the bulk crystalline AlN substrate is plasma treated 110. The wet phase surface treatment follows the gas phase treatment. During the wet phase treatment, organics and metals are removed 120 from the surface of the AlN substrate in a wet chemical process. The substrate surface is heated in an ammonia-rich ambient above 1000° C. 130 prior to epitaxial growth 140 of a III-N layer on the substrate. The ammonia ambient provides an abundant source of nitrogen atoms that suppress nitrogen dissociation from the AlN crystal. The ammonia overpressure also suppresses surface defect formation on AlN substrate. Hydrogen is typically flowed concurrently with ammonia to produce a reducing ambient. The pre-epitaxial growth surface preparation process shown in FIG. 1 allows for achieving reproducible epitaxial growth with good surface morphology.

Prior to the gas phase treatment 110 illustrated in FIG. 1, the AlN substrate surface may optionally be cleaned by exposing the surface to a chemical solution. For example, in some cases, the surface may be exposed to least one of acetone, methanol, isopropyl alcohol, sulfuric acid, phosphoric acid, nitric acid, and hydrochloric acid. In some cases, the substrate is dipped in a 3:1 solution of $H_2SO_4/H_3PO_4$ which helps to remove organic contamination prior to the gas phase treatment. Chemicals, such as $H_2SO_4$, $H_2O_2$, $H_3PO_4$, and $H_2O$ may be used in different ratios and temperatures. The solution can be ultrasonically agitated to enhance this optional cleaning process.

To facilitate carrying out the gas phase plasma treatment, the AlN substrate may be positioned and secured in a reaction chamber by mounting the AlN substrate on a carrier wafer, e.g., a Si carrier wafer, with a small amount of adhesive material, such as Shipley 1818 photoresist. The surface of the AlN substrate is then plasma etched by a chemically assisted ion beam. The plasma beam may comprise argon (Ar) and may be generated by electron cyclotron resonance (ECR) or may be generated by an inductively coupled plasma source. If ECR-generated Ar plasma is used, the ECR plasma generator may have a microwave power of about 350 W, a magnetic flux density of 1200 gauss, an accelerator voltage of about 100 Volts and a beam voltage of about 550 volts.

The plasma treatment process involves a stream of plasma that impinges on the substrate surface while a halogen-containing gas is introduced and/or is present in the reaction chamber. In various implementations, the halogen-containing gas may comprise one or both of chlorine ($Cl_2$) and boron trichloride ($BCl_3$). For example, in one example implementation, during the plasma treatment, $BCl_3$ gas flows into the plasma treatment reaction chamber at a flow rate of about 2 cc/min, $Cl_2$ gas flows into the plasma treatment reaction chamber at a flow rate of about 8 cc/min, and Ar gas flows into the plasma treatment reaction chamber at a flow rate of about 5 cc/min. The substrate surface may be plasma etched until about 360 nm of the substrate material is removed from the surface.

In some implementations, during the plasma treatment, the surface of the substrate being etched is oriented substantially perpendicular to the plasma stream. To facilitate even exposure to the plasma across the surface, the surface can be rotated around an axis normal to the surface at about 10 degrees per second. The temperature of the etched surface is maintained at about 25° C. during the plasma treatment.

In other plasma treatment implementations, the surface of the AlN substrate is plasma etched by a reactive ion process without an ion beam. These reactive ion processes utilize reactive gasses such as chlorine or boron trichloride plasmas, and is typically achieved using inductively-coupled plasma (ICP).

The wet phase treatment follows the gas phase plasma treatment. During the wet phase treatment, organics and metals are removed from the substrate surface. The organics and metals may be removed, for example, by chemically treating the plasma-etched surface in one or more of sulfuric, phosphoric, nitric, and hydrochloric acid. In some implementations, the surface may be treated in sulfuric and phosphoric acid in a 3:1 solution which is heated to about 95 degrees C. for at least about 15 minutes.

Following the wet phase treatment, the substrate surface is heated in an ammonia-rich ambient to a temperature of above about 1000° C. for a period of time without epitaxial growth. For example, the substrate surface can be heated to about 1225° C. while $H_2$ and/or $NH_3$ are present in the reaction chamber. The flow rate of each of $NH_3$ and $H_2$ into the reaction chamber can be greater than about 2 L/min, e.g., in some cases about 4 L/min, during this step of the surface treatment. The heating process follows the wet phase treatment and may be performed after the substrate is placed in the MOCVD chamber, for example.

Following the heat treatment process, a III-nitride layer is epitaxially grown on the surface. For example, the epitaxially grown layer may be or include $In_yAl_xGa_{1-x-y}N$, where $0 \leq x \leq 1$ and $0 \leq y \leq 1$. The epitaxial layer can be grown to a thickness of about 500 nm, for example. Multiple layers with different alloy molar fractions can be grown with high crystal quality.

Figure 2:
FIG. 2 is a photograph that shows the surface of a sample that was prepared with only an initial cleaning treatment.
Figure 3:
FIG. 3 is a photograph that shows the surface of a sample that was prepared with the pre-growth treatment outlined in the flow diagram of FIG. 1.

FIGS. 2 and 3 are photographs that show surfaces of 500 nm-thick n-$Al_{0.74}Ga_{0.26}N$ heterostructures grown simultaneously on the same AlN substrate which was cut into half and prepared with different pre-growth treatments. FIG. 2 shows the surface of a sample that was prepared with only an chemical treatment involving ultrasonic agitation in acetone and methanol, followed by surface treatment with a mixture of sulfuric and phosphoric acid. The sample shown in FIG. 3 was prepared with the pre-growth treatment outlined in the flow diagram of FIG. 1, i.e., a gas phase treatment followed by a wet phase treatment, followed by heating prior to epitaxial growth. No other surface treatments were applied.

The substrate surface that was not treated using the pre-growth treatment shows a high density of hexagonal pits. If a heterostructure comprising one or more epitaxial layers is grown on a substrate surface having these hexagonal pits, such as a light-emitting heterostructure, the pits propagate to the active layer, causing defects and optical scattering loss. The substrate surface shown in FIG. 2 (initial cleaning only) had a root mean squared (RMS) roughness of about 2.5 nm as measured by atomic force microscopy (AFM). In comparison, the substrate surface shown in FIG. 3 (initial cleaning+ pre-growth treatment) had an AFM RMS roughness of 1.2 nm, less than half the AFM RMS roughness of the non-pre-growth treatment sample.

Figure 4:
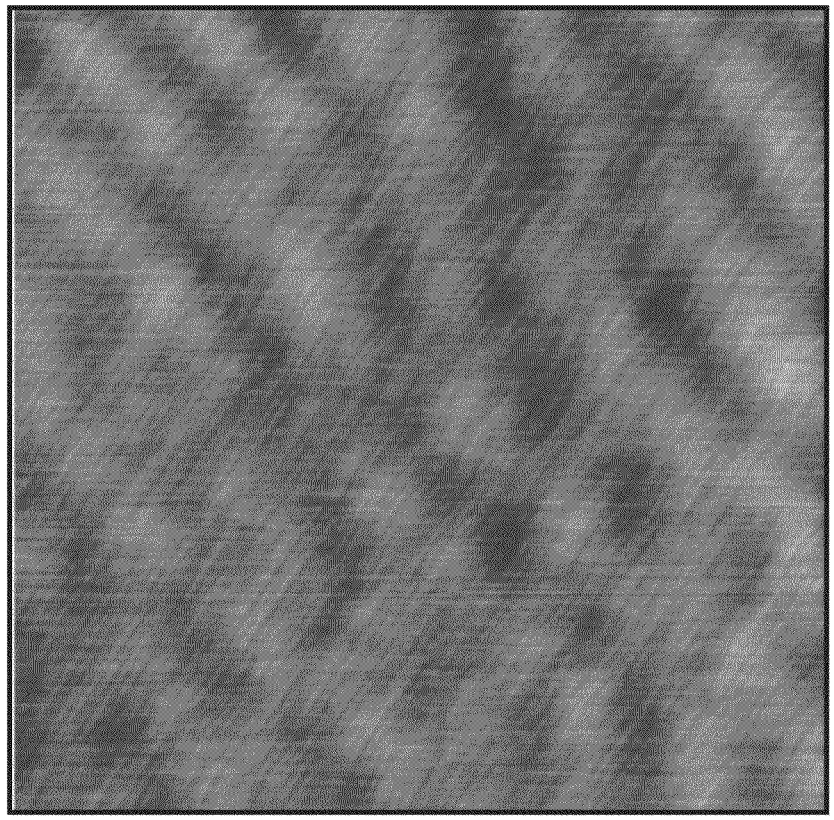
FIG. 4 shows an atomic force microscopy scan of a 480 nm-thick homoepitaxial AlN layer grown on an AlN substrate prepared with the pre-growth treatment according to embodiments discussed herein.
Figure 5:
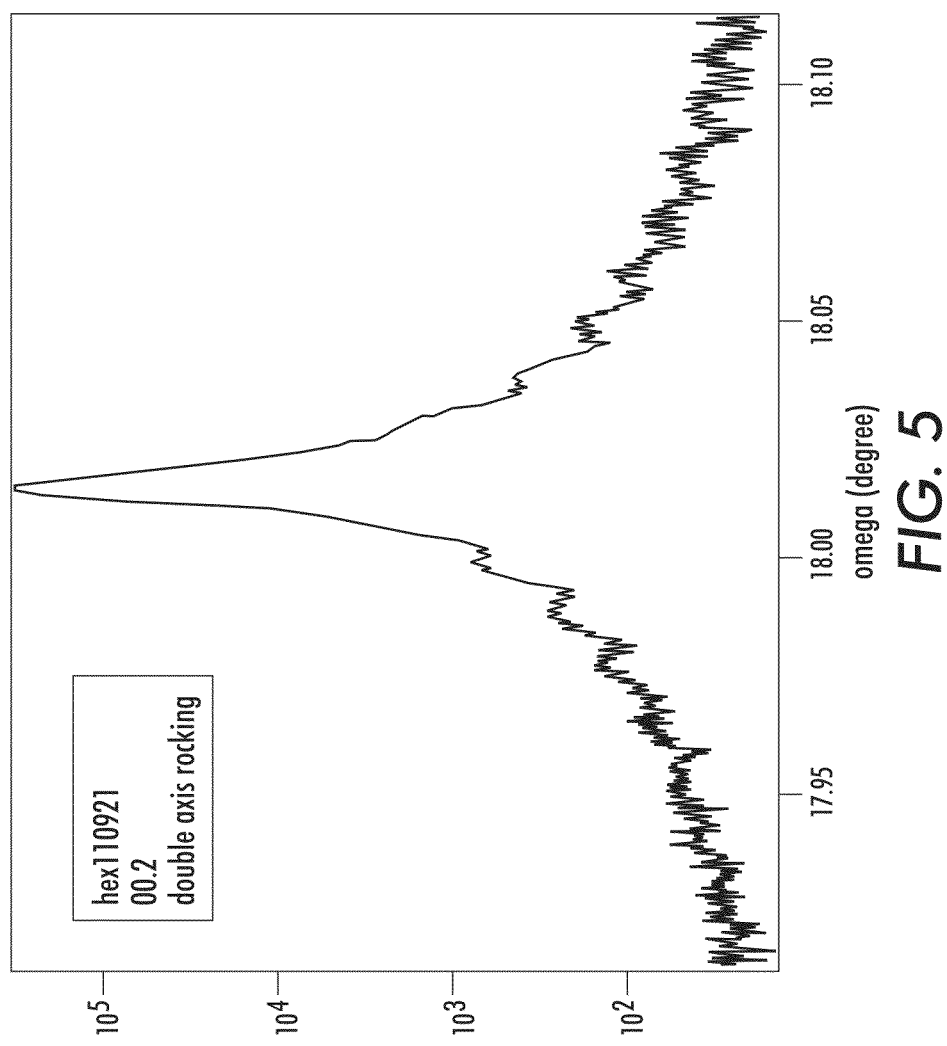
FIG. 5 shows the symmetric (002) X-ray spectra of the homoepitaxial AlN layer of FIG. 4.
Figure 6:
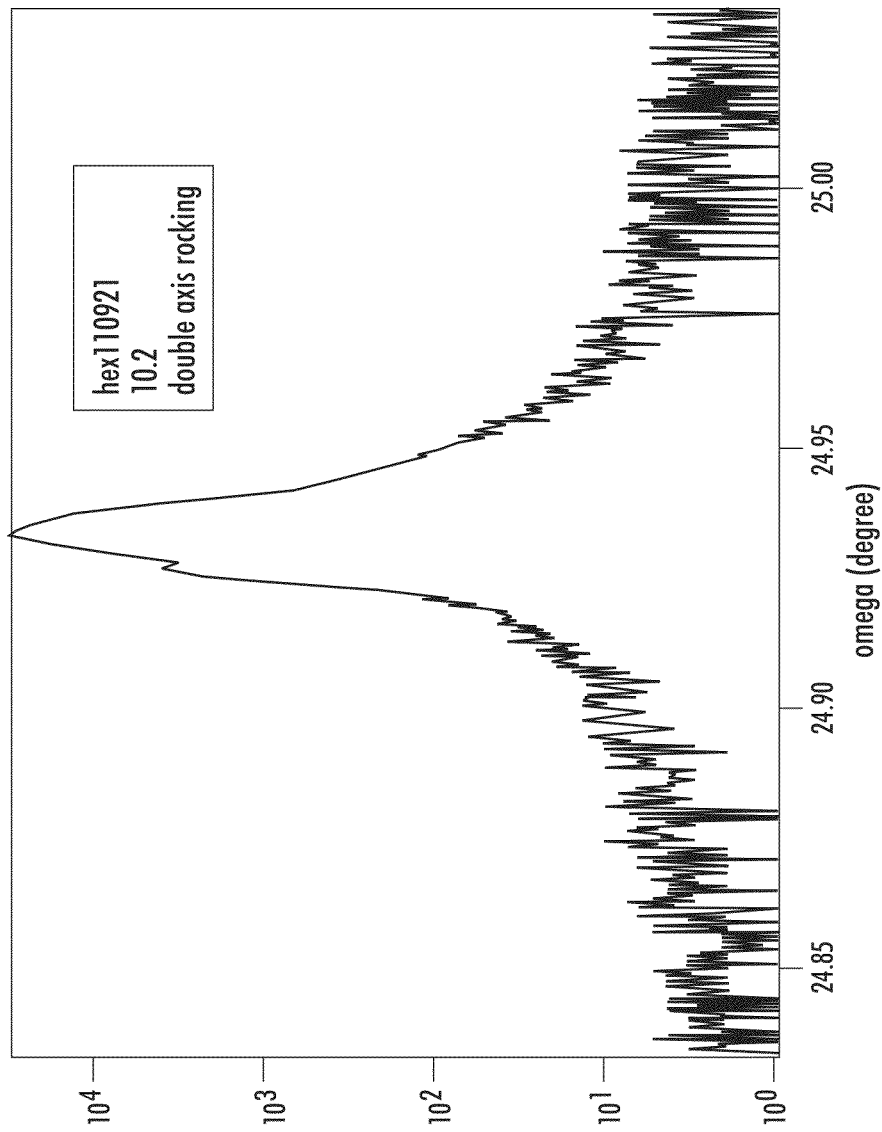
FIG. 6 shows the asymmetric X-ray spectra of the homoepitaxial AlN layer of FIG. 4.

FIG. 4 shows an AFM scan of a 480 nm-thick homoepitaxial AlN layer grown on an AlN substrate prepared with the pre-growth treatment outlined in the flow diagram of FIG. 1. No other treatments were applied to the substrate surface. The surface shows very nice step-flow growth with no visible defect features. The RMS roughness of this sample is 0.13 nm. FIG. 5 shows the symmetric (002) X-ray spectra of the homoepitaxial AlN layer of FIG. 4. FIG. 6 shows the asymmetric X-ray spectra of the homoepitaxial AlN layer of FIG. 4. These spectra show narrow linewidths of less than 80 arcsec. The fringe pattern in the spectra indicates a desirable very sharp interface between the film and the substrate.

A number of values and ranges are provided in various aspects of the implementations described. These values and ranges are to be treated as examples only, and are not intended to limit the scope of the claims. For example, embodiments described in this disclosure can be practiced throughout the disclosed numerical ranges. In addition, a number of materials are identified as suitable for various facets of the implementations. These materials are to be treated as exemplary, and are not intended to limit the scope of the claims.

The foregoing description of various embodiments has been presented for the purposes of illustration and description and not limitation. The embodiments disclosed are not intended to be exhaustive or to limit the possible implementations to the embodiments disclosed. Many modifications and variations are possible in view of the above teaching.

What is claimed is:

1. An epitaxial growth method, comprising:
    plasma treating a surface of a bulk crystalline Aluminum Nitride (AlN) substrate;
    after the plasma treating, removing organics and metals from the surface using one or more chemical etchants;
    after removing the organics and metals, heating the surface in an ammonia-rich ambient environment to a temperature of above 1000° C. for at least 5 minutes without epitaxial growth; and
    after heating the surface, epitaxially growing a III-nitride layer on the surface.

2. The method of claim 1 further comprising, before plasma treating the surface, exposing the surface to at least one of acetone, methanol, isopropyl alcohol, sulfuric acid, phosphoric acid, nitric acid, and hydrochloric acid.

3. The method of claim 1, wherein heating the surface comprises introducing $H_2$ into a reaction chamber that encloses the surface.

4. The method of claim 3, wherein heating the surface comprises:
    introducing the $H_2$ into the reaction chamber at a flow rate of greater than about 2 L/min; and
    introducing $NH_3$ into the reaction chamber at a flow rate of greater than about 2 L/minute.

5. An epitaxial growth method, comprising:
    plasma treating a surface of a bulk crystalline Aluminum Nitride (AlN) substrate, wherein plasma treating the surface comprises:
        accelerating Ar plasma toward the surface; and
        flowing a halogen-containing gas near the surface during a time that the Ar plasma is accelerated toward the surface;
    after the plasma treating, removing organics and metals from the surface using one or more chemical etchants;
    after removing the organics and metals, heating the surface in an ammonia-rich ambient environment to a temperature of above 1000° C. for at least 5 minutes without epitaxial growth; and
    after heating the surface, epitaxially growing a III-nitride layer on the surface.

6. The method of claim 5, wherein the halogen-containing gas comprises one or more of chlorine ($Cl_2$) and boron trichloride ($BCl_3$).

7. The method of claim 5, wherein flowing the halogen-containing gas comprises:
    flowing $BCl_3$ gas at a flow rate of about 2 cc/min;
    flowing $Cl_2$ gas at a flow rate of about 8 cc/min; and
    flowing Ar gas at a flow rate of about 5 cc/min.

8. The method of claim 5, wherein accelerating the plasma toward the surface comprises generating Ar plasma using electron cyclotron resonance with one or more of a microwave power of about 350 W, a magnetic flux density of about 1200 gauss, an accelerator voltage of about 100 Volts, and a beam voltage of about 550 volts.

9. The method of claim 5, further comprising:
    orienting the surface substantially perpendicular to the Ar plasma that is accelerated toward the surface;
    maintaining a temperature of the surface at about 25 degrees C. during the plasma treatment; and
    rotating the surface around an axis normal to the surface at about 10 degrees per second.

10. The method of claim 1, wherein plasma treating the surface comprises plasma treating the surface for about 30 minutes.

11. The method of claim 1, wherein plasma treating the surface comprises plasma etching using an inductively coupled plasma.

12. The method of claim 1, wherein plasma treating the surface comprises plasma etching using a chemically-assisted ion beam.

13. The method of claim 1, wherein plasma treating comprises plasma treating until about 360 nm of substrate material is removed from the surface.

14. The method of claim 1, wherein removing the organics and metals from the surface using one or more chemical etchants comprises chemical processing using one or more of sulfuric, phosphoric, nitric, and hydrochloric acid.

15. The method of claim 14, wherein chemical processing comprises chemical processing in sulfuric and phosphoric acid in a 3:1 solution heated to about 95 degrees C. for at least about 15 minutes.

16. The method of claim 1, wherein the epitaxially grown III-nitride layer comprises $In_yAl_xGa_{1-x-y}N$, wherein $0 \leq x \leq 1$, $0 \leq y \leq 1$.

17. The method of claim 1, wherein an exposed surface of the epitaxially grown III-nitride layer has a surface roughness less than about 10 nm.

18. An epitaxial growth method, comprising:
    plasma treating a surface of a bulk crystalline Aluminum Nitride (AlN) substrate, comprising:
        accelerating Ar plasma toward the surface; and
        flowing a halogen-containing gas comprising one or more of chlorine and boron trichloride near the surface during a time that the Ar plasma is accelerated toward the surface;
    after the plasma treating, removing organics and metals from the surface using one or more chemical etchants;
    after removing the organics and metals, heating the surface in an ammonia-rich ambient environment to a temperature of above 1000° C. for at least 5 minutes without epitaxial growth; and
    after heating the surface, epitaxially growing an $In_yAl_xGa_{1-x-y}N$ layer on the surface, wherein $0 \leq x \leq 1$ and $0 \leq y \leq 1$.

19. The method of claim 18, wherein an exposed surface of the $In_yAl_xGa_{1-x-y}N$ layer has a surface roughness less than about 10 nm.

20. An epitaxial growth method, comprising:
    exposing a surface of a bulk crystalline Aluminum Nitride (AlN) substrate to at least one of acetone, methanol, isopropyl alcohol, sulfuric acid, phosphoric acid, nitric acid, and hydrochloric acid;

after exposing the surface, plasma treating the surface;

after plasma treating the surface, removing organics and metals from the surface using one or more chemical etchants;

after removing the organics and metals, heating the surface in an ammonia-rich ambient environment to a temperature of above 1000° C. for at least 5 minutes without epitaxial growth; and after heating the surface, epitaxially growing a III-nitride layer on the surface.

21. The method of claim 20, wherein plasma treating the surface comprises:

accelerating Ar plasma toward the surface while flowing a halogen-containing gas near the surface.

22. The method of claim 21, wherein flowing the halogen-containing gas comprises:

flowing $BCl_3$ gas at a flow rate of about 2 cc/min;

flowing $Cl_2$ gas at a flow rate of about 8 cc/min; and flowing Ar gas at a flow rate of about 5 cc/min.

* * * * *